United States Patent [19]

Kondo et al.

[11] Patent Number: 5,250,385

[45] Date of Patent: Oct. 5, 1993

[54] PHOTOPOLYMERIZABLE COMPOSITION

[75] Inventors: Syunichi Kondo; Yoshimasa Aotani; Akira Umehara, all of Shizuoka; Tsuguo Yamaoka, Funabashi, all of Japan

[73] Assignee: Fuji Photo Film Co., Ltd., Minami-Ashigara, Japan

[21] Appl. No.: 752,783

[22] Filed: Aug. 30, 1991

[30] Foreign Application Priority Data

Sep. 3, 1990 [JP] Japan ................. 2-232978

[51] Int. Cl.$^5$ .................... G03F 7/008; G03F 7/029
[52] U.S. Cl. .................... 430/192; 430/285; 430/287; 430/281; 430/284; 522/31; 522/32
[58] Field of Search ................. 522/31, 32; 430/281, 430/287, 284, 285

[56] References Cited

U.S. PATENT DOCUMENTS

| | | | |
|---|---|---|---|
| 4,069,054 | 1/1978 | Smith | 522/31 X |
| 4,108,747 | 8/1978 | Crivello | 430/281 X |
| 4,245,029 | 1/1981 | Crivello | 522/31 X |
| 4,423,136 | 12/1983 | Crivello et al. | 522/31 X |
| 4,659,649 | 4/1987 | Dickinson et al. | 522/25 X |
| 4,954,416 | 9/1990 | Wright et al. | 522/31 X |

FOREIGN PATENT DOCUMENTS

0333224A2  9/1989  European Pat. Off.

*Primary Examiner*—Cynthia Hamilton
*Attorney, Agent, or Firm*—Burns, Doane, Swecker & Mathis

[57] ABSTRACT

A photopolymerizable composition comprises a photopolymerizable ethylenically unsaturated compound having at least two terminal ethylene groups, a photopolymerization initiator and an organic polymer binder, wherein the photopolymerization initiator is an aromatic sulfonic acid salt of an onium compound. The composition has high sensitivity to actinic rays over a wide range of wavelength extending from ultraviolet to visible region and thus can be used for preparing a lithographic printing plate, a resin-letterpress plate, a resist or photomask for making a printed board, a monochromatic and colored sheet for transfer or color-development and a color-developing sheet.

19 Claims, No Drawings

PHOTOPOLYMERIZABLE COMPOSITION

BACKGROUND OF THE INVENTION

1. Field of the Invention

The present invention relates to a photopolymerizable composition and more specifically to a photopolymerizable composition which has high sensitivity and can be used for preparing a lithographic printing plate, a resin-letterpress plate, a resist or photomask for making a printed board, a monochromatic and colored sheet for transfer or color-development and a color-developing sheet.

2. Prior Art

There have conventionally been known a variety of photographic image-forming systems in which a ardenable organic component carrying an ethylenically unsaturated group is used for forming images. The organic component can undergoes an optically induced addition reaction of the ethylenically unsaturated groups, typically a polymerization or crosslinking reaction to cause hardening to thus give images.

As other photographic image-forming systems, there have also been known systems which comprise a combination of a leuco dye which can develop the color through an oxidation reaction or a reaction with an acid and a radical-generating agent which acts as an oxidizing agent or an acid. Examples of such systems are disclosed in, for instance, Phot. Sci. Eng., p. 598 (1961); and U.S. Pat. Nos. 3,042,515 and 3,615,568.

Among these image-forming methods which comprise the use of a light-sensitive composition containing a hardenable organic component carrying an ethylenically unsaturated group, presently there has widely been well known a method which comprises duplicating images through a photographic technique using a light-sensitive composition comprising, for instance, a polymerizable ethylenically unsaturated compound, a photopolymerization initiator, a linear polymeric compound having a film-forming ability and a heat polymerization inhibitor. As described in, for instance, Japanese Patent Publication for Opposition Purpose (hereinafter referred to as "J.P. KOKOKU") Nos. Sho 35-5093 and Sho 35-8495, the light-sensitive composition causes photopolymerization by irradiation of actinic light rays and is correspondingly made insoluble. Therefore, a desired photopolymerized images can be obtained by applying a light-sensitive composition in the form of a proper film, irradiating the light-sensitive layer with actinic light rays through a negative film carrying a desired image and then removing only the unexposed areas with a proper solvent (hereinafter referred to as simply "development"). The light-sensitive composition of this type is very useful as the light-sensitive layer of a presensitized plate for use in making a lithographic printing plate (hereinafter referred to as "PS plate"). Typical examples of photopolymerization initiators for these photopolymerizable ethylenically unsaturated compounds include benzyl, benzoin, benzoin ethyl ether, anthraquinone, acridine, phenazine, benzophenone and 2-ethylanthraquinone. However, these photopolymerization initiators are responsive o ultraviolet rays having short wavelengths, but have low sensitivity and further is not almost responsive to visible light rays such as argon ion laser rays having long wavelengths and thus have insufficient ability of initiating polymerization.

On the other hand, there has been forwarded the development of light-sensitive materials responsive to visible light rays and there have been proposed, for instance, a composite system comprising an photoreducible dye and an aliphatic amine as disclosed in J.P. KOKOKU No. Sho 44-20189; a composite system comprising a cyclic cis-$\alpha$-dicarbonyl compound and a dye as disclosed in Japanese Patent Unexamined Publication (hereinafter referred to as "J.P. KOKAI") No. Sho 48-84183; a system comprising a hexaaryl biimidazole, a radical generator and a dye as disclosed in J.P. KOKOKU No. Sho 45-37377; a system comprising a hexaaryl biimidazole and a p-dialkylaminobenzylideneacetone as disclosed in J.P. KOKAI Nos. Sho 47-2528 and Sho 54-155292; and a system comprising a substituted triazine and a merocyanine dye as disclosed in J.P. KOKAI No. Sho 54-151024.

Recently, there has been investigated a method for forming images by using a laser and a laser facsimile or the like has already been put to practical use. For this reason, there has correspondingly been desired for the development of light-sensitive composition having high sensitivity applicable to these recently-developed methods, but any composition having sufficient sensitivity has not yet been developed.

SUMMARY OF THE INVENTION

Accordingly, an object of the present invention is to provide a photopolymerizable composition having high sensitivity to a light ray having any desired wavelength extending from ultraviolet and visible ranges, good storage stability and heat stability.

The inventors of this invention have conducted various studies to achieve the foregoing object and, as a result, have found out that aromatic sulfonic acid salts of onium compounds can substantially accelerate the photopolymerization rate of polymerizable compounds carrying an ethylenically unsaturated double bond and thus have completed the present invention.

According to the present invention, there is provided a photopolymerizable composition which comprises a photopolymerizable ethylenically unsaturated compound having at least two terminal ethylene groups, a photopolymerization initiator and an organic polymer binder wherein the photopolymerization initiator is an aromatic sulfonic acid salt of an onium compound.

The diphenyl iodonium compounds and triphenylsulfonium compounds have been known as initiators for cation polymerization (see J. Polymer Sci. Symposium, No. 56 (1976) p. 383; and J. Polymer Sci. Polymer Chemistry Edition, 22 (1984) pp. 69–76).

However, these compounds have seldom been used as initiators for radical polymerization and there has not yet been known the use of the aromatic sulfonic acid salt of onium compounds as in the present invention. Likewise, it has not yet been known that the aromatic sulfonic acid moiety is improved so as to have absorption at a longer wavelength region to thus make the compound responsive to a light ray having a long wavelength.

The photopolymerizable composition of the present invention comprises a photopolymerizable ethylenically unsaturated compound, an aromatic sulfonic acid salt of an onium compound and an organic polymer binder, and it is a negative-working light-sensitive composition having high sensitivity to ultraviolet and visible light rays as well as electron beams or X-rays.

DETAILED DESCRIPTION OF THE PREFERRED EMBODIMENTS

The present invention will hereunder be described in more detail.

The photopolymerizable ethylenically unsaturated compounds used in the invention are compounds having at least two terminal ethylene groups and a boiling point under atmospheric pressure of not less than 100° C.

Such compounds are in the chemical form of, for instance, monomers, prepolymers, i.e., dimers, trimers and oligomers, or mixture or copolymer thereof. Examples of monomers and copolymers thereof are esters of unsaturated carboxylic acids with aliphatic polyhydric alcohols and amides of unsaturated carboxylic acids with aliphatic polyvalent amines.

Specific examples of the ester monomers of unsaturated carboxylic acids with aliphatic polyhydric alcohols include acrylates such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomers; methacrylates such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, depentaerythritol hexamethacrylate, sorbitol trimethacrylate, sorbitol tetramethacrylate, bis [p-(3-methacryloxy-2-hydroxypropoxy)phenyl ] dimethylmethane and bis [p-(acryloxyethoxy)phenyl] dimethylmethane; itaconates such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; crotonates such as ethylene glycol dicrotonate, tetramethylene glycol dicrotonate, pentaerythritol dicrotonate and sorbitol tetracrotonate; isocrotonates such as ethylene glycol diisocrotonate, pentaerythritol diisocrotonate and sorbitol tetraisocrotonate; maleates such as ethylene glycol dimaleate, triethylene glycol dimaleate, pentaerythritol dimaleate and sorbitol tetramaleate; and mixture thereof.

Specific examples of the amide monomers of aliphatic polyvalent amines and unsaturated carboxylic acids are methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Examples of the foregoing compounds further include vinylurethane compounds having at least two polymerizable vinyl groups in a molecule obtained by adding vinyl monomers having a hydroxyl group represented by the following general formula (A) to polyisocyanate compounds carrying at least two isocyanate groups in a molecule as disclosed in J.P. KOKOKO No. Sho 48-41708:

$$CH_2=C(R)COOCH_2 CH(R')OH \quad (A)$$

wherein R and R' each represents H or $CH_3$; as well as urethane acrylates as disclosed in J.P. KOKAI No. Sho 51-37193; polyester acrylates as disclosed in J.P. KOKOKU Nos. Sho 49-43191 and Sho 52-30490 and J.P. KOKAI No. Sho 48-64183; polyfunctional acrylates and methacrylates such as epoxy acrylates obtained by reacting epoxy resins with (meth)acrylic acid; and those disclosed in Bulletin of Adhesive Society of Japan, 20, No. 7, (1984) pp. 300–308 as photohardenable monomers and oligomers. The amount of these compounds to be used ranges from 5 to 50% by weight (hereinafter simply referred to as "%") and preferably 10 to 40% on the basis of the total weight of the photopolymerizable composition.

The photopolymerization initiators used in the composition of the invention will hereunder be described in more detail.

The aromatic sulfonic acid salts of the onium compounds used in the present invention as photopolymerization initiators are those represented by the following general formulae (1) and (2):

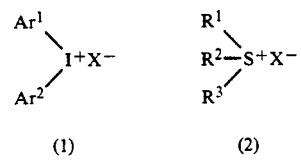

wherein $Ar^1$ and $Ar^2$ may be the same or different and each represents a substituted or unsubstituted aryl group. The substituents of the aryl group are preferably selected from the group consisting of alkyl, haloalkyl, cycloalkyl, aryl, alkoxy, nitro, carbonyl, alkoxycarbonyl, hydroxy and mercapto groups and halogen atoms and more preferably selected from alkyl groups having 1 to 8 carbon atoms, alkoxy groups having 1 to 8 carbon atoms, nitro group and chlorine atom.

$R^1$, $R^2$ and $R^3$ may be the same or different and each represents a substituted or unsubstituted alkyl or aryl group and preferably an aryl group having 6 to 14 carbon atoms, an alkyl group having 1 to 8 carbon atoms or a substituted derivative thereof.

Preferred substituents for the aryl group are, for instance, alkoxy groups having 1 to 8 carbon atoms, alkyl groups having 1 to 8 carbon atoms, nitro group, carbonyl group, hydroxyl group and halogen atoms and those for the alkyl group are, for instance, alkoxy groups having 1 to 8 carbon atoms, carbonyl group and alkoxycarbonyl groups.

Each two of $R^1$, $R^2$ and $R^3$, and $Ar^1$ and $Ar^2$ may be bonded together through a single bond or a substituent.

X represents an aromatic sulfonate anion. Specific examples thereof include anions derived from condensed polynuclear aromatic sulfonic acids such as naphthalene-1-sulfonic acid, naphthalene-2-sulfonic acid, anthracene-1-sulfonic acid, 9-nitroanthracene-1-sulfonic acid, 9,10-dichloroanthracene-2-sulfonic acid, 9,10-dimethoxyanthracene-2-sulfonic acid, 9,10-diethoxyanthracene-2-sulfonic acid, anthracene-2-sulfonic acid, phenanthrene-2-sulfonic acid, 9-bromophenanthrene-3-sulfonic acid, 1-methyl-7-isopropylphenanth rene-3-sulfonic acid, pyrene-2-sulfonic acid, benz [a]anthracene-4-sulfonic acid, triphenylene-2-sulfonic acid, chrysene-6-sulfonic acid, 5,6-dichloroanthracene-3-sulfonic acid, 6-nitroacenaphthene-5-sulfonic acid and 2-t-butylnaphthalene-7-sulfonic acid; anthraquinonesulfonic acids and phenanthraquinone sulfonic acids such as 9,10-dioxo-9,10-dihydroanthracene-2-sulfonic acid, 1-bromo-9,10-dioxo-9,10-dihydroanthracene-2-sulfonic acid, 2-chloro-9,10-dioxo-9,10-dihydroanthracene-2-sulfonic acid and 9,10-dioxo-9,10-dihydrophenanthrene-3-sulfonic acid; naphthoquinonesulfonic acids such as 1,2-naphthoquinone-4-sulfonic acid, 1,2-naphthoquinone-diazido-4-sulfonic acid and 1,2-naphthoquinone-diazido-5-sulfonic acid; and sulfonate group-containing dyes such as 2-hydroxy-4-methoxybenzophenone-5-sulfonic acid, Phenol Red, Methyl Orange, Alizarine S, Indigo Carmine, Patent Blue, Chlorophenol Red and Chrysophenine, but the invention is not restricted to these specific examples.

Specific examples of these compounds are as follows:

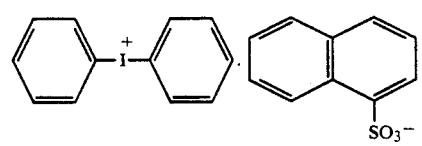

(1-1)

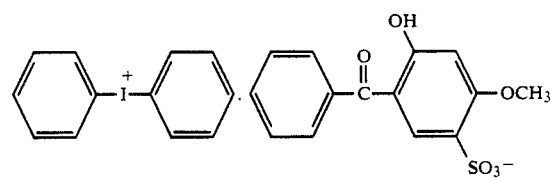

(1-2)

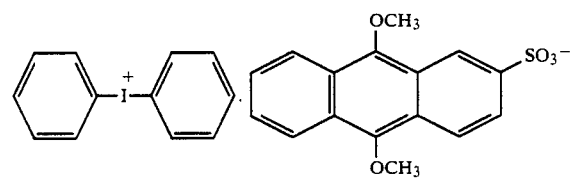

(1-3)

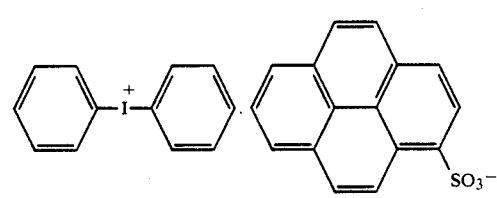

(1-4)

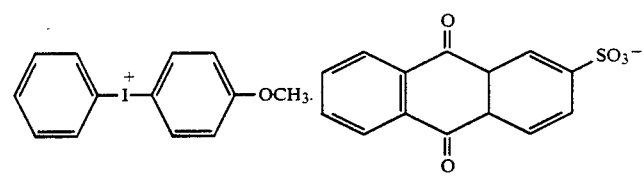

(1-5)

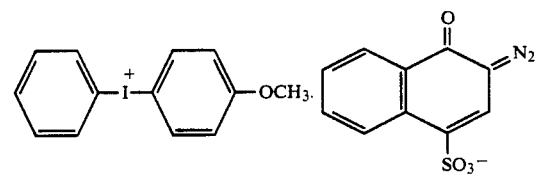

(1-6)

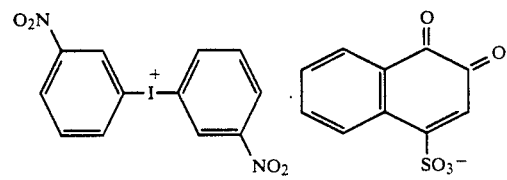

(1-7)

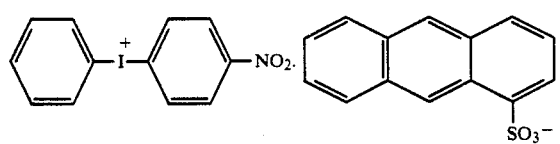
(1-8)
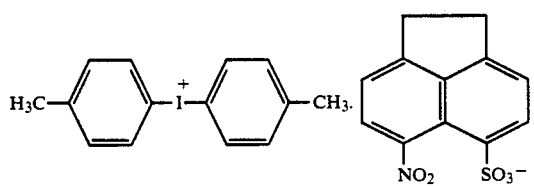
(1-9)
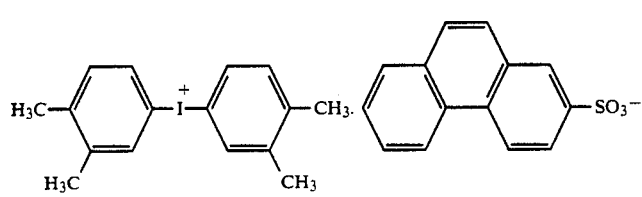
(1-10)
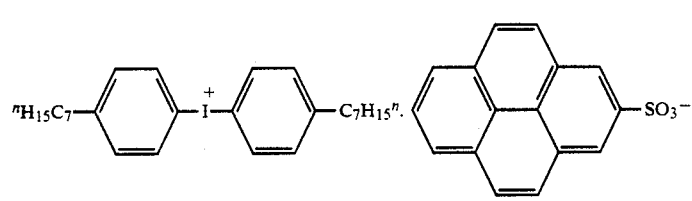
(1-11)
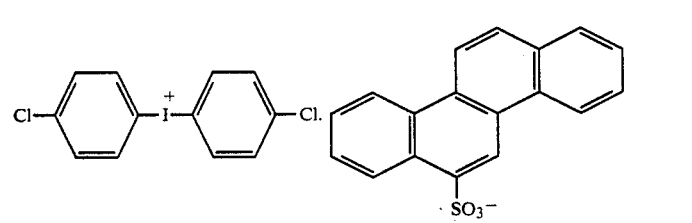
(1-12)
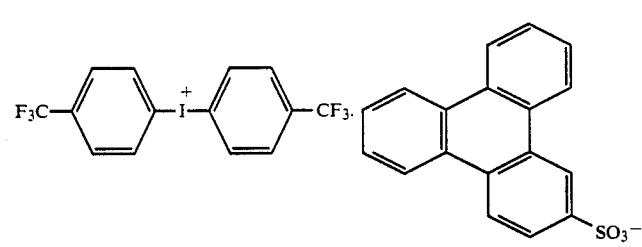
(1-13)
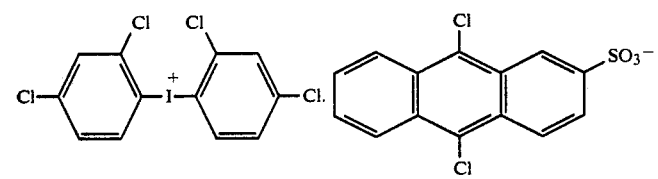
(1-14)
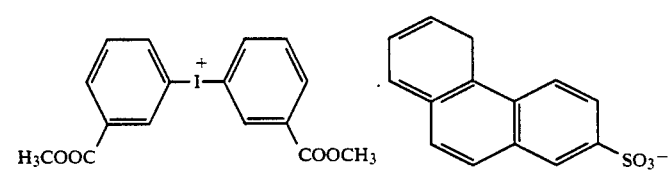
(1-15)

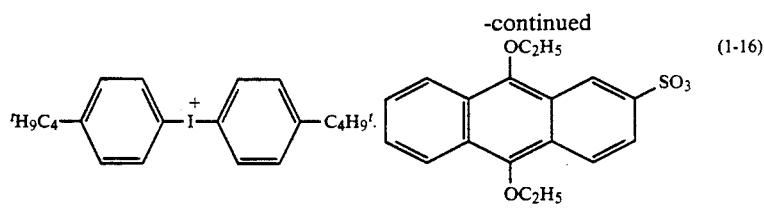
(1-16)
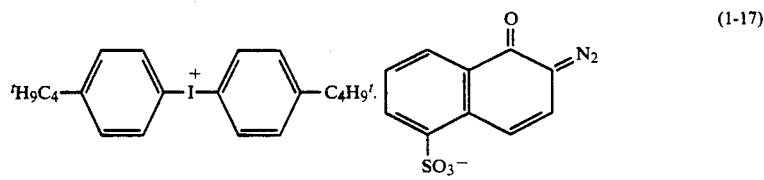
(1-17)
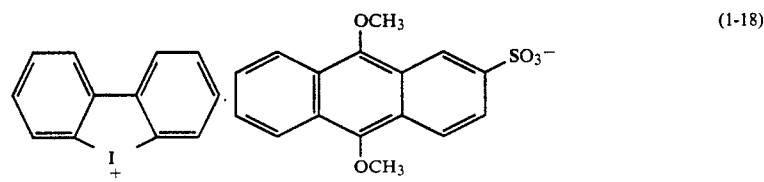
(1-18)
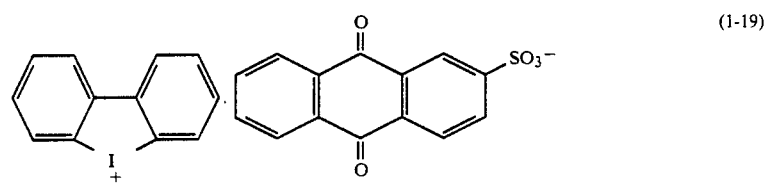
(1-19)
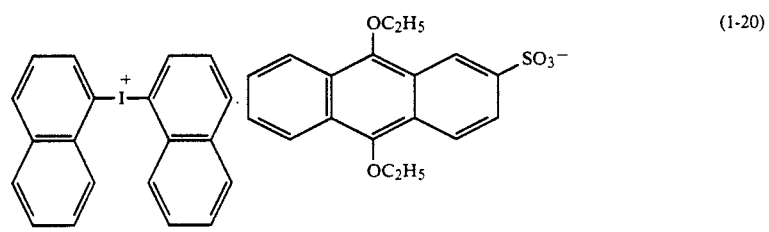
(1-20)
Moreover, specific examples of the compounds represented by the general formula (2) are those listed below:
(2-1)
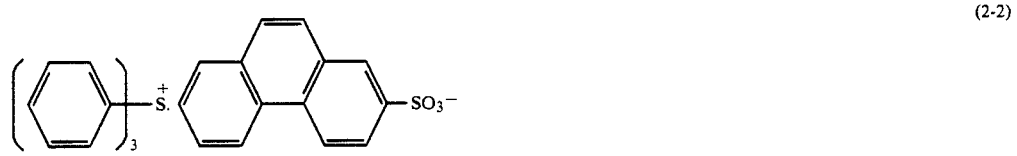
(2-2)
(2-3)

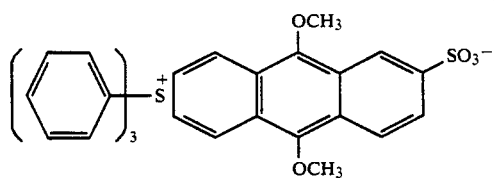
(2-4)
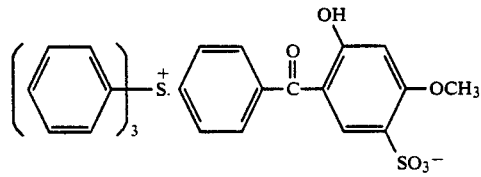
(2-5)
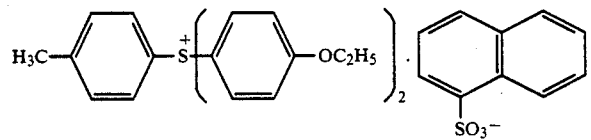
(2-6)
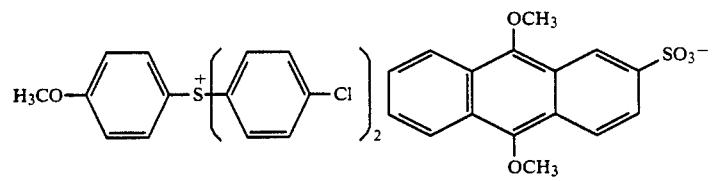
(2-7)
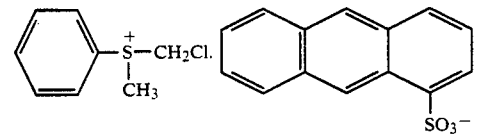
(2-8)
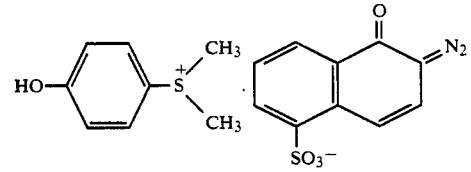
(2-9)
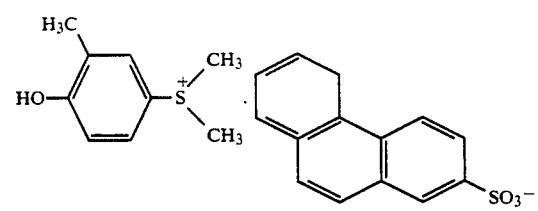
(2-10)
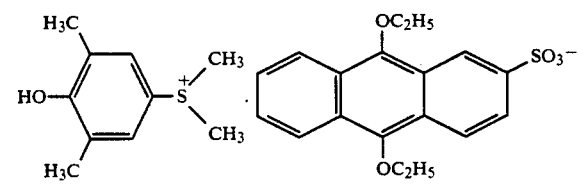
(2-11)
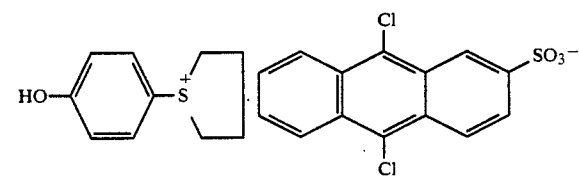
(2-12)

-continued
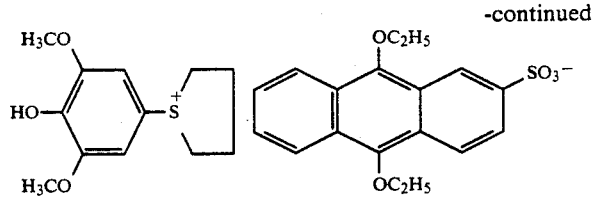 (2-13)
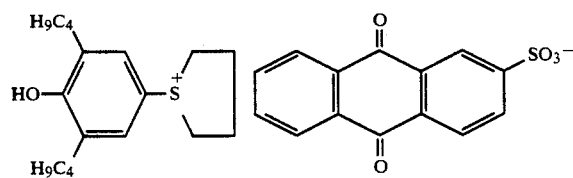 (2-14)
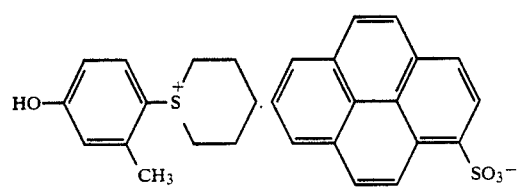 (2-15)
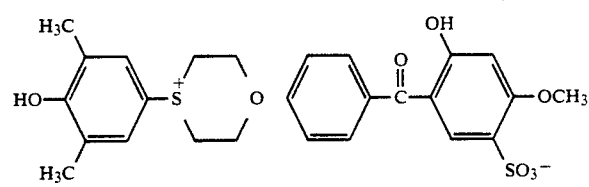 (2-16)
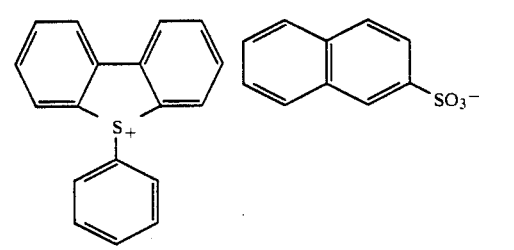 (2-17)
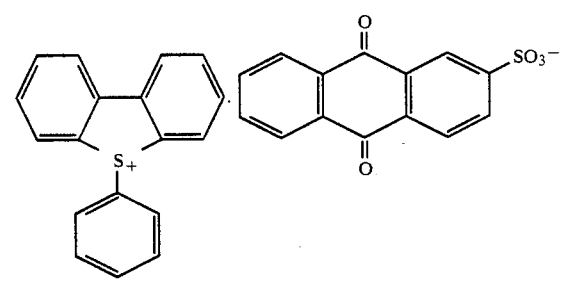 (2-18)
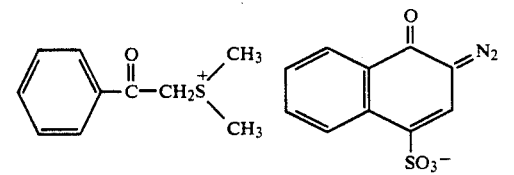 (2-19)
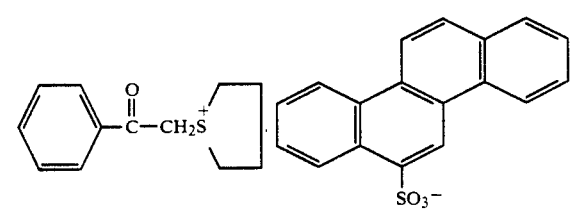 (2-20)

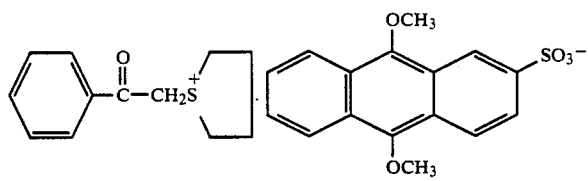 (2-21)
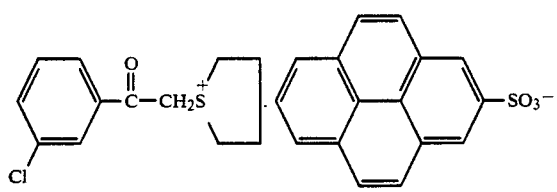 (2-22)
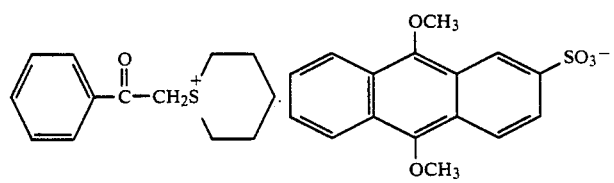 (2-23)
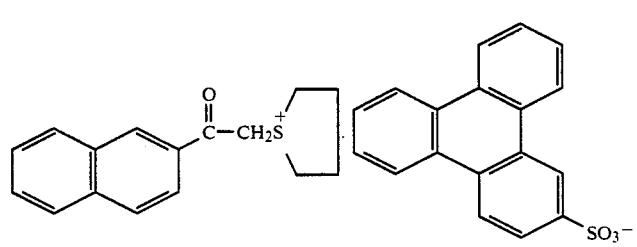 (2-24)
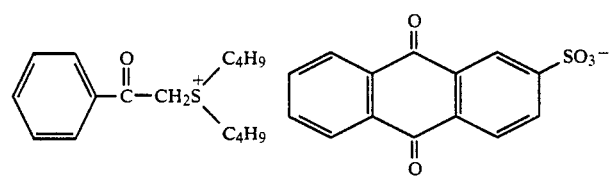 (2-25)
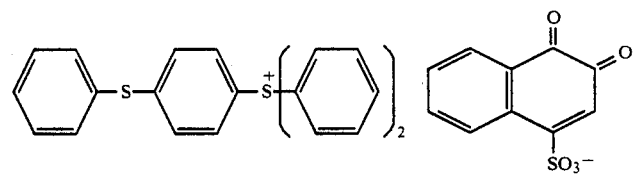 (2-26)
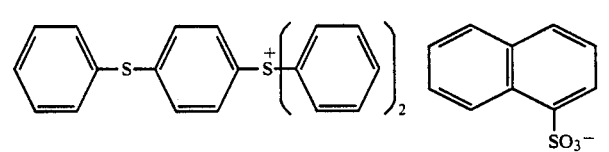 (2-27)
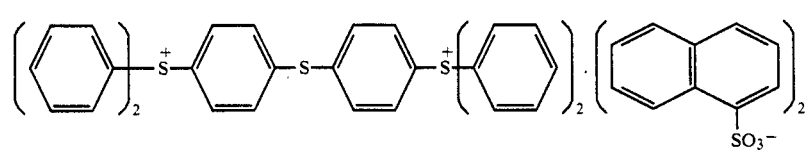 (2-28)

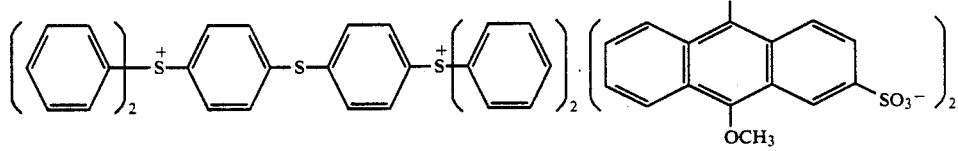

The amount of the aromatic sulfonic acid salt of onium compound ranges from 0.01 to 50 parts by weight, preferably from 0.1 to 20 parts by weight per 100 parts by weight of the photopolymerizable ethylenically unsaturated compound.

The foregoing compounds represented by the general formulae (1) and (2) can be prepared by adding an aqueous or alcoholic solution of an aromatic sulfonic acid or a sodium salt thereof to an aqueous or alcoholic solution of a halide, bisulfate or perhydrohalide of an onium compound prepared by the procedures disclosed in, for instance, J. W. Knapczyk et al., J. Am. Chem. Soc., 91 (1969) p. 145; A. L. Maycock et al., J. Org. Chem., 35 (1970) p. 2532; E. Goethals et al., Bull. Soc. Chem. Belg., 73 (1964) p. 546; H. M. Leicester, J. Am. Chem. Soc., 51 (1929) p. 3587; J. V. Crivello et al., J. Polym. Soc. Polym. Chem. Ed., 18 (1980) p. 2677; U.S. Pat. Nos. 2,807,648 and 4,247,473; F. M. Beringer et al., J. Am. Chem. Soc., 75 (1953) p. 2705; and J.P. KOKAI No. Sho 53-101331 and then recovering the resulting precipitates through filtration.

In addition, if desired, the photopolymerizable composition of the invention may be added with a hydrogen donor compound such as N-phenylglycine, 2-mercaptobenzothiazole or alkyl N,N-dialkylbenzoates to further improve the ability of initiating the photpolymerization of the composition. Such a hydrogen donor compound is added to the light-sensitive composition of the invention in an amount preferably ranging from 1 to 30% on the basis of the total weight of the composition.

The organic polymer binders used in the present invention are linear organic polymers and are arbitrarily selected from the group consisting of polymers having compatibility with the photopolymerizable ethylenically unsaturated compound. It is preferred to select the binders from linear organic polymers which are soluble in water or a mild alkaline aqueous solution or swelling with these liquids so that the resulting light-sensitive layer can be developed with water or a mild alkaline aqueous solution.

As has been discussed above, the linear organic polymer not only serves as the film-forming agents of the composition but also serves to impart developability with water, a mild alkaline aqueous solution or an organic solvent to the resulting light-sensitive layer. For instance, if a water-soluble organic polymer is used as the binder, the resulting layer can be developed with water. Examples of such water-soluble linear organic polymers are addition polymers having carboxyl groups on the side chains thereof as disclosed in J.P. KOKAI Nos. Sho 59-44615, Sho 54-92723, Sho 59-53836 and Sho 59-71048 and J.P. KOKOKU Nos. Sho 54-34327, Sho 58-12577 and Sho 54-25957, more specifically methacrylic acid copolymers, acrylic acid copolymers, itaconic acid copolymers, crotonic acid copolymers, maleic acid copolymers and partially esterified maleic acid copolymers. Examples of such polymer further include acidic cellulose derivatives having carboxyl groups on the side chains thereof and compounds obtained by adding a cyclic acid anhydride to an addition polymer having hydroxyl groups. Particularly preferred examples of these compounds are copolymers of benzyl (meth)acrylate/(meth)acrylic acid/optional other addition polymerizable vinyl monomers and allyl (meth)acrylate/(meth) acrylic acid/optional other addition polymerizable vinyl monomers.

In addition to the foregoing polymers, polyvinyl pyrrolidone and polyethylene oxides are also preferred as the water-soluble polymer. Further, an alcohol-soluble nylon and/or a polyether of 2,2-bis(4-hydroxyphenyl)propane and epichlorohydrin are also useful to enhance the strength of the hardened film. These linear organic polymers may be incorporated into the composition in any amount. However, if it exceeds 90%, the resulting images do not have satisfactory strength. For this reason, the amount thereof preferably ranges from 30 to 85%. Moreover, the weight ratio of the polymerizable ethylenically unsaturated compound to the linear organic polymer preferably ranges from 1/9 to 7/3 and more preferably from 3/7 to 5/5.

In addition to the foregoing components, the light-sensitive composition of the present invention may desirably comprise a small amount of a heat polymerization inhibitor for preventing the undesirable heat polymerization of the polymerizable ethylenically unsaturated compound during the production of the composition or the storage thereof. Examples of suitable heat polymerization inhibitors are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis (4-methyl-6-t-butylphenol), 2-mercaptobenzimidazole and cerium(III) salt of N-nitrosophenyl hydroxylamine. The amount of the heat polymerization inhibitor preferably ranges from about 0.01% to about 5% by weight on the basis of the total weight of the light-sensitive composition. Further, the composition may optionally comprise a higher fatty acid or derivative thereof such as behenic acid or a behenic acid amide to make the compound spread over the surface of the resulting light-sensitive layer to thus prevent the polymerization-inhibitory effect of oxygen. The amount of the higher fatty acid or derivative thereof preferably ranges from about 0.5% to about 10% on the basis of the total weight of the composition.

Further, the photopolymerizable composition may comprise a dye or pigment for dyeing the resulting light-sensitive layer. The amount of the dye or pigment to be incorporated preferably ranges from about 0.5% to about 5% on the basis of the total weight of the composition. Moreover, the composition may comprise an inorganic filler and/or other known additives for improving the physical properties of the resulting hardened film.

The photopolymerizable composition of the invention is dissolved in a variety of organic solvents and then applied onto the surface of a substrate to give a light-sensitive layer. Examples of the solvent used herein include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol monoethyl ether acetate, ethylene glycol monoisopropyl ether, ethylene glycol monobutyl ether acetate, 3-methoxypropanol, methoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used alone or in combination. The concentration of the coating solution suitably ranges from 2 to 50% expressed in terms of the solid content thereof.

The coating amount of the photopolymerizable composition to be applied onto the surface of the substrate preferably ranges from about 0.1 g/m$^2$ to about 10 g/m$^2$ (weighed after drying) and more preferably from 0.5 to 5 g/m$^2$.

The foregoing substrate may be a plate-like material having good dimensional stability. Examples of such dimensionally stable plate-like material are paper, paper laminated with a plastic film such as a polyethylene, polypropylene or polystyrene film, metal plates such as aluminum (inclusive of aluminum alloy) plate, zinc plate and steel plate, plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal films and paper or plastic films which are laminated with a foil of the foregoing metal or those having a deposited layer of the foregoing metal. Among these substrates, particularly preferred are aluminum plates because of the dimensional stability and low price. Preferred substrates further include, for instance, composite sheets such as those comprising a polyethylene terephthalate film and an aluminum sheet bonded thereto as disclosed in J.P. KOKOKU No. Sho 48-18327.

The substrate having a metal surface, in particular, aluminum surface are preferably subjected to surface-treatments such as graining, a dipping treatment in an aqueous solution of sodium silicate, potassium fluorozirconate, phosphate or the like and/or an anodization treatment.

Preferably used are aluminum plates which are immersed in an aqueous solution of sodium silicate after the graining. Suitably used are aluminum substrates which are anodized and then immersed in an aqueous solution of an alkali metal silicate as disclosed in J.P. KOKOKU No. Sho 47-5125. The foregoing anodization treatment can be performed by passing an electric current through an aluminum plate serving as an anode in an electrolyte selected from the group consisting of aqueous and non-aqueous solutions of inorganic acids such as phosphoric acid, chromic acid, sulfuric acid or boric acid or organic acids such as oxalic acid or sulfamic acid or mixture thereof.

It is also effective to use silicate-electrodeposition as disclosed in U.S. Pat. No. 3,658,662 as the foregoing surface-treatment.

Useful surface-treatments further include, for instance, combination of electrolytic graining, the foregoing anodization and the treatment with sodium silicate as disclosed in J.P. KOKOKU No. Sho 46-27481 and J.P. KOKAI Nos. Sho 52-58602 and Sho 52-30503.

Further, the aluminum plate may be suitably subjected to a mechanical graining, a chemical etching, electrolytic graining, an anodization treatment and a silicate treatment in this order as disclosed in J.P. KOKAI No. Sho 56-28893.

After these surface treatments, an underlying coating may be applied to the substrate. Such an underlying coating can be obtained from a water-soluble resin such as polyvinylphosphonic acid, a polymer or copolymer having sulfonate groups on the side chains, polyacrylic acid, a water-soluble metal salt such as zinc borate, a yellow dye or an amine salt.

These hydrophilization treatments are performed not only for making the surface of the substrate hydrophilic but also for preventing detrimental reactions with the photopolymerizable composition subsequently applied thereto and for enhancing the adhesion to the light-sensitive layer.

A protective layer may be applied onto the layer of the photopolymerizable composition applied to the substrate in order to eliminate the polymerization-inhibitory effect of oxygen in the air. The protective layer can be formed from a polymer having excellent oxygen barrier properties such as polyvinyl alcohol, in particular, those having a degree of saponification of not less than 99% and acidic celluloses. The method for applying such a protective layer is detailed in, for instance, U.S. patent No. 3,458,311 and J.P. KOKOKU No. Sho 55-49729.

The photopolymerizable composition Of the present invention has wide variety of applications. For instance, the composition can undergo the usual photopolymerization reaction and can be used as photoresists in making lithographic printing plates and printed boards. In particular, good results can be obtained if the photopolymerizable composition of the present invention is used as the light-sensitive material for imagewise exposing with visible laser rays such as $Ar^-$ laser rays since the composition has high sensitivity and is responsive to light of wavelengths extending up to visible region.

The light-sensitive material comprising the photopolymerizable composition of the present invention is imagewise exposed to light and then the unexposed areas are removed by treating with a developer to give images. Examples of preferred developers used when the photopolymerizable composition is employed for making a light-sensitive layer of a lithographic printing plate are those described in J.P. KOKOKU No. Sho 57-7427 and specific examples thereof preferably used include aqueous solutions of inorganic alkaline agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia, or organic alkaline agents such as monoethanolamine or diethanolamine. The concentration of the alkaline solution ranges from 0.1 to 10% by weight, preferably 0.5 to 5% by weight.

The alkaline aqueous solution may optionally comprise small amounts of a surfactant and/or an organic solvent such as benzyl alcohol, 2-phenoxyethanol or 2-butoxyethanol. Examples of such developers are disclosed in, for instance, U.S. Pat. Nos. 3,375,171 and 3,615,480. Preferred developers are also disclosed in J.P. KOKAI Nos. Sho 50-26601 and Sho 58-54341 and J.P. KOKOKU Nos. Sho 56-39464 and Sho 56-42860.

The photopolymerizable composition of the present invention has high sensitivity to actinic rays over a wide range of wavelengths extending from ultraviolet to visible regions. Therefore, as the light sources usable in exposure processes, there may be mentioned, for instance, super high pressure, high pressure, medium pressure and low pressure mercury lamps, chemical lamps, carbon arc lamps, xenon lamps, metal halide lamps, various laser lamps emitting light rays from visible to ultraviolet regions, fluorescent tubes, tungsten lamps and solar rays.

The present invention will hereinafter be described in more detail with reference to the following non-limitative working Examples and the effect practically attained by the invention will also be discussed in detail in comparison with Comparative Examples.

EXAMPLES 1 TO 14 AND COMPARATIVE EXAMPLES 1 TO 5

The surface of an aluminum plate having a thickness of 0.30 mm was grained with an aqueous suspension of pumice (400 mesh) and a nylon brush and then the plate was sufficiently washed with water. After etching the plate by immersing it in a 10% aqueous solution of sodium hydroxide at 70° C. for 60 seconds, the plate was washed with running water, neutralized and washed with a 20% nitric acid solution and then washed with water. The plate was electrolytically surface-roughened under conditions of a voltage of 12.7 V and an anode time electricity of 160 coulomb/dm² in a 1% aqueous solution of nitric acid. The surface roughness was determined at this stage and found to be 0.6μ (in terms of Ra unit). Subsequently, the plate was immersed in a 30% aqueous sulfuric acid solution at 55° C. for 2 minutes to perform desmutting and then anodized at a current density of 2 A/dm² for 2 minutes in a 20% aqueous sulfuric acid solution so that the thickness of the resulting anodic oxide layer reached 2.7 g/m².

A light-sensitive solution having the following composition was applied onto the surface of the alumina plate thus treated in an amount of 1.5 g/m² (weighted after drying) and then dried at 80° C. for 2 minutes to give a light-sensitive layer.

| Light-Sensitive Solution | |
|---|---|
| Trimethylolpropane triacrylate | 2.0 g |
| Allyl methacrylate/methacrylic acid copolymer (molar ratio of copolymerization: 80/20) | 2.0 g |
| Initiator (see Table I) | X g |
| Cu-Phthalocyanine Pigment | 0.2 g |
| Fluorine atom-containing nonionic surfactant (Fluorad FC-430, available from 3M Corporation) | 0.03 g |
| Methyl ethyl ketone | 20 g |
| Propylene glycol monomethyl ether acetate | 20 g |

On the light-sensitive layer, there was applied a 3% by weight solution of polyvinyl alcohol (degree of saponification: 86.5 to 89 mole %; degree of polymerization: 1,000) in an amount of 2 g/m² (weighed after drying) and then dried at 100° C. for 2 minutes.

Light sensitivity of the resulting PS plates was evaluated with Eye Rotary Exposure Machine (Eye Graphics Co., Ltd., light source: metal halide lamp). The sensitivity was determined with the aid of Fuji PS Step Guide (available from Fuji Photo Film Co., Ltd.: step tablet having 15 steps whose initial step had a transmission optical density of 0.05 and whose optical density difference was 0.15). The sensitivity was expressed in terms of the number of clear steps of the PS Step Guide observed when each PS plate was exposed with an illuminance determined at the light-sensitive film surface of 200 Lux for 20 seconds.

The development of these exposed PS plates was carried out by immersing them in a developer having the following composition at 25° C. for one minute.

| Developer | |
|---|---|
| 1K Potassium silicate | 30 g |
| Potassium hydroxide | 15 g |
| Compound of the following formula: | 3 g |

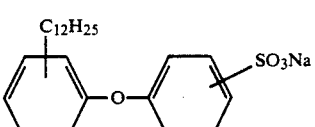

| Water | 1000 g |

The results of the sensitivity measurement observed when the kinds and amounts of the photopolymerization initiators were variously changed are summarized in Table I given below.

TABLE I

| Ex. No. | Kind of Initiator | (amount: g) | Sensitivity (No. of clear steps of Step Guide) |
|---|---|---|---|
| 1 | Exemplified Compound (1-1) | (0.05) | 9 |
| 2 | " | (0.1) | 10 |
| 3 | " | (0.2) | 11 |
| 4 | Exemplified Compound (1-2) | (0.1) | 12 |
| 5 | Exemplified Compound (1-3) | (0.1) | 13 |
| 6 | Exemplified Compound (1-5) | (0.1) | 9 |
| 7 | Exemplified Compound (1-10) | (0.1) | 11 |
| 8 | Exemplified Compound (1-16) | (0.1) | 12 |
| 9 | Exemplified Compound (1-18) | (0.1) | 12 |
| 10 | Exemplified Compound (2-2) | (0.1) | 12 |
| 11 | Exemplified Compound (2-4) | (0.1) | 13 |
| 12 | Exemplified Compound (2-6) | (0.1) | 11 |
| 13 | Exemplified Compound (2-16) | (0.1) | 12 |
| 14 | Exemplified Compound (2-21) | (0.1) | 10 |
| 1* | Cl salt of diphenyl iodonium | (0.1) | 1 |
| 2* | PF₆ salt of diphenyl iodonium | (0.1) | 1 |
| 3* | BF₄ salt of diphenyl iodonium | (0.1) | 1 |
| 4* | Cl salt of triphenylsulfonium | (0.1) | 2 |
| 5* | PF₆ salt of triphenylsulfonium | (0.1) | 2 |

*Comparative Example

EXAMPLES 15 TO 18 AND COMPARATIVE EXAMPLES 6 AND 7

The same procedures used in Example 1 were repeated except that the aluminum plate was anodized at a current density of 2 A/dm² for 2 minutes in a 5% aqueous solution of phosphoric acid so that the thickness of the resulting anodic oxide layer was 0.8 g/m² instead of the anodization in a 20% aqueous solution of sulfuric acid performed in Example 1 and then treated with a 3% aqueous sodium silicate solution at 70° C. for 10 seconds to form an aluminum substrate. A coating solution having the following composition was applied onto the resulting aluminum substrate and then dried to give a light-sensitive layer.

| Light-Sensitive Solution | |
|---|---|
| Trimethylolpropane trimethacrylate | 2.3 g |

| Light-Sensitive Solution | |
|---|---|
| Benzyl methacrylate/methacrylic acid copolymer (molar ratio of copolymerization: 65/35) | 3.0 g |
| Initiator (see Table II) | 0.1 g |
| Cu-Phthalocyanine Pigment | 0.2 g |
| Fluorine atom-containing nonionic surfactant (Fluorad FC-430 available from 3M Corporation) | 0.03 g |
| Methyl ethyl ketone | 20 g |
| Propylene glycol monomethyl ether acetate | 20 g |

The weight of the dried coated light-sensitive layer was found to be 1.5 g/m². Then an oxygen barrier layer of polyvinyl alcohol was applied onto the light-sensitive layer as in Example 1, the resulting PS plates were exposed to light in the same manner as used in Example 1 and developed by immersing them in a developer having the following composition as disclosed in J.P. KOKOKU No. Sho 56-42860 at 25 ° C. for one minute.

| Developer | |
|---|---|
| Sodium sulfite | 3 g |
| Benzyl alcohol | 30 g |
| Triethanolamine | 20 g |
| Monoethanolamine | 5 g |
| Pelex NBL (sodium t-butylnaphthalenesulfonate; available from Kao Atlas Co., Ltd.) | 30 g |
| Water | 1000 g |

The results of the sensitivity measurement observed when the kinds of the initiators were variously changed are listed in the following Table II.

TABLE II

| Ex. No. | Kind of Initiator | Sensitivity (No. of clear steps of Step Guide) |
|---|---|---|
| 15 | Exemplified Compound (1-1) | 8 |
| 16 | Exemplified Compound (1-3) | 10 |
| 17 | Exemplified Compound (1-5) | 7 |
| 18 | Exemplified Compound (1-3) | 9 |
| 6* | PF₆ salt of diphenyl iodonium | 0 |
| 7* | PF₆ salt of triphenylsulfonium | 0 |

*Comparative Example

What is claimed is:

1. A photopolymerizable composition comprising (i) a photopolymerizable ethylenically unsaturated compound having at least two terminal ethylene groups, (ii) a photopolymerization initiator, and (iii) an organic polymer binder, wherein the photopolymerization initiator is an aromatic sulfonic acid salt of an onium compound selected from the group consisting of compounds represented by the following general formulae (1) or (2):

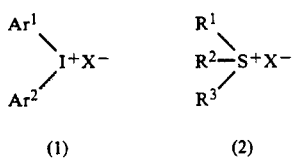

wherein $Ar^1$ and $Ar^2$, may be the same or different, and each represents a substituted or unsubstituted aryl group, the substituents of the aryl group being selected from the group consisting of alkyl, haloalkyl, cycloalkyl, aryl, alkoxy, nitro, carbonyl, alkoxycarbonyl, hydroxyl and mercapto groups and halogen atoms; $R^1$, $R^2$ and $R^3$, may be the same or different, and each represents a substituted or unsubstituted alkyl or aryl group, with the proviso that each two of $R^1$, $R^2$ and $R^3$, and $Ar^1$ and $Ar^2$ may be bonded together through a single bond or a substituent; and X represents an aromatic sulfonate anion selected from the group consisting of those derived from condensed polynuclear aromatic sulfonic acids, anthraquinonesulfonic acids and phenanthraquinonesulfonic acids, naphthoquinonesulfonic acids, and sulfonate group-containing dyes.

2. The photopolymerizable composition of claim 1 wherein the aromatic sulfonic acid is selected from the group consisting of naphthalene-1-sulfonic acid, naphthalene-2-sulfonic acid, anthracene-1-sulfonic acid, 9-nitroanthracene-1-sulfonic acid, 9, 10-dichloroanthracene-2-sulfonic acid, 9,10-dimethoxyanthracene-2-sulfonic acid, 9,10-diethoxyanthracene-2-sulfonic acid, anthracene 2-sulfonic acid, phenanthrene-2-sulfonic acid, 9-bromophenanthrene-3-sulfonic acid, 1-methyl-7-isopropylphenanth rene-3-sulfonic acid, pyrene-2-sulfonic acid, benz [a] anthracene-4-sulfonic acid, triphenylene-2-sulfonic acid, chrysene-6-sulfonic acid, 5,6-dichloroanthracene-3-sulfonic acid, 6-nitroacenapthene-5-sulfonic acid, 2-t-butylnaphthalene-7-sulfonic acid, 9,10-dioxo-9,10-dihydroanthracene-2-sulfonic acid, 1-bromo-9,10-dioxo-9,10-dihydroanthracene-2-sulfonic acid, 2-chloro-9,10-dioxo-9,10-dihydroanthracene-2-sulfonic acid, 9,10-dioxo-9,10-dihydrophenanthrene-3-sulfonic acid, 1,2-naphthoquinone-4-sulfonic acid, 1,2-naphthoquinone-diazido-4-sulfonic acid, 1,2-naphthoquinone-diazido-5-sulfonic acid, 2-hydroxy-4-methoxybenzophenone-5-sulfonic acid, Phenol Red, Methyl Orange, Alizarine S, Indigo Carmine, Patent Blue, Chlorophenol Red and Chrysophenine.

3. The photopolymerizable composition of claim 1, comprising a compound of formula (2), wherein $R^1$, $R^2$ and $R^3$ each represents an aryl group having 6 to 14 carbon atoms, or an alkyl group having 1 to 8 carbon atoms.

4. The photopolymerizable composition of claim 3, wherein at least one aryl group or at least one alkyl group is substituted the substituent or substituents for the aryl group or groups being selected from alkoxy groups having 1 to 8 carbon atoms, alkyl groups having 1 to 8 carbon atoms, nitro group, carbonyl group, hydroxyl group and halogen atoms, and wherein the substituent or substituents for the alkyl group or groups being selected from alkoxy groups having 1 to 8 carbon atoms, carbonyl group and alkoxycarbonyl groups.

5. The photopolymerizable composition of claim 1 wherein Ar and $Ar^2$ each represents a substituted aryl group which is substituted with substituents selected from the group consisting of alkyl groups having 1 to 8 carbon atoms, alkoxy groups having 1 to 8 carbon atoms, nitro group and chlorine atom.

6. The photopolymerizable composition of claim 1 wherein the amount of the polymerization initiator ranges from 0.01 to 50 parts by weight per 100 parts by weight of the photopolymerizable ethylenically unsaturated compound.

7. The photopolymerizable composition of claim 6 wherein the amount of the polymerization initiator ranges from 0.1 to 20 parts by weight per 100 parts by weight of the photopolymerizable ethylenically unsaturated compound.

8. The photopolymerizable composition of claim 1 wherein the photopolymerizable ethylenically unsaturated compound is a compound having at least two terminal ethylene groups and a boiling point under atmospheric pressure of not less than 100° C.

9. The photopolymerizable composition of claim 8 wherein the photopolymerizable ethylenically unsaturated compound is an ester of an unsaturated carboxylic acid with an aliphatic polyhydric alcohol or an amide of an unsaturated carboxylic acid with an aliphatic polyvalent amine.

10. The photopolymerizable composition of claim 9 wherein the ester monomer of an unsaturated carboxylic acid with an aliphatic polyhydric alcohol is selected from the group consisting of acrylates, methacrylates, itaconates, crotonates, isocrotonates, maleates and mixture thereof.

11. The photopolymerizable composition of claim 10 wherein the ester monomer is a member selected from the group consisting of ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomers, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy) phenyl] dimethylmethane, bis (p-(acryloxyethoxy)phenyl) dimethylmethane, ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, ethylene glycol dicrotonate, tetramethylene glycol dicrotonate, pentaerythritol dicrotonate, sorbitol tetracrotonate, ethylene glycol diisocrotonate, pentaerythritol diisocrotonate, sorbitol tetraisocrotonate, ethylene glycol dimaleate, triethylene glycol dimaleate, pentaerythritol dimaleate, sorbitol tetramaleate and mixture thereof.

12. The photopolymerizable composition of claim 10 wherein the amide monomer is a member selected from the group consisting of methylenebisacrylamide, methylenebismethacrylamide, 1,6-hexamethylenebisacrylamide, 1,6-hexamethylenebismethacrylamide, diethylenetriamine-trisacrylamide, xylylenebisacrylamide, xylylenebismethacrylamide, vinylurethane compounds having at least two polymerizable vinyl groups in a molecule obtained by adding vinyl monomers having a hydroxyl group represented by the following general formula (A) to polyisocyanate compounds carrying at least two isocyanate groups in a molecule:

$$CH_2=C(R)COOCH_2 CH(R')OH \qquad (A)$$

wherein R and R' each represents H or $CH_3$, urethane acrylates, or polyester acrylates.

13. The photopolymerizable composition according to claim 12, wherein at least one of R and R' is a polyfunctional (meth)acrylate.

14. The photopolymerizable composition of claim 1 wherein the amount of the polymerizable ethylenically unsaturated compound ranges from 5 to 50% by weight on the basis of the total weight of the photopolymerizable composition.

15. The photopolymerizable composition of claim 14 wherein the amount of the polymerizable ethylenically unsaturated compound ranges from 10 to 40% on the basis of the total weight of the photopolymerizable composition.

16. The photopolymerizable composition of claim 1 further comprising a hydrogen donor compound in an amount ranging from 1 to 30% on the basis of the total weight of the composition.

17. The photopolymerizable composition of claim 1 wherein the organic polymer binder is selected from the group consisting of linear organic polymers which are soluble in water or a mild alkaline aqueous solution or swelling with these liquids and the amount thereof ranges from 30 to 85%.

18. The photopolymerizable composition of claim 1 further comprising a heat polymerization inhibitor in an amount ranging from about 0.01 to 5% by weight on the basis of the total weight of the composition.

19. The photopolymerizable composition of claim 18 wherein the heat polymerization inhibitor is selected from the group consisting of hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis (4-methyl-6-t-butylphenol), 2-mercaptobenzimidazole and cerium(III) salt of N-nitrosophenyl hydroxylamine.

* * * * *